(12) United States Patent
Glasser

(10) Patent No.: US 7,691,549 B1
(45) Date of Patent: Apr. 6, 2010

(54) MULTIPLE EXPOSURE LITHOGRAPHY TECHNIQUE AND METHOD

(75) Inventor: Lance A. Glasser, Saratoga, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 480 days.

(21) Appl. No.: 11/675,529

(22) Filed: Feb. 15, 2007

(51) Int. Cl.
*G03C 5/00* (2006.01)
*G03F 9/00* (2006.01)

(52) U.S. Cl. .......................... 430/22; 430/30; 430/312; 430/328; 430/329; 430/942

(58) Field of Classification Search ................ 430/22, 430/30, 312, 328, 329
See application file for complete search history.

(56) References Cited

U.S. PATENT DOCUMENTS 6,228,564 B1 * 5/2001 Huggins ..................... 430/328
6,451,508 B1 * 9/2002 Bukofsky et al. ........... 430/311
6,492,073 B1 * 12/2002 Lin et al. ....................... 430/5

\* cited by examiner

*Primary Examiner*—Christopher G Young
(74) *Attorney, Agent, or Firm*—Suiter Swantz pc llo

(57) ABSTRACT

A method for forming high resolution patterns on a substrate surface is disclosed. A photolithographic patterning tool is loaded with a substrate having a photoimagable layer. Multiple exposures to using interference patterns and developments are performed on the photoimagable layer to define a composite line pattern in the photoimagable layer. The composite line pattern having a greater pitch density than possible with single exposure with the same photolithographic patterning tool. The lines of the composite line pattern are selectively cut or trimmed at a plurality of locations to define a desired pattern in the photoimageable layer. The cuts can themselves be achieved with a plurality of photomasks or exposure to direct write tools to achieve densities beyond that allowed by $k_1 > 0.25$ limit.

20 Claims, 6 Drawing Sheets

MULTIPLE EXPOSURE LITHOGRAPHY TECHNIQUE AND METHOD

TECHNICAL FIELD

The invention described herein relates generally to the formation of multi-exposure dense lithographic patterns using new approaches and methodologies. In particular, the invention relates to systems and methods for generating densely patterned images having a resolution beyond that of existing technologies. Moreover, aspects of the invention are directed to increasing the effective resolution of existing tools and technologies. Such methodologies can be employed in the fabrication of high definition photoresist patterns and/or resultant high definition substrate patterns.

BACKGROUND

As the density and complexity of microcircuits continue to increase, the photolithographic processes used to print circuit patterns becomes more and more challenging. Previous technologies and thinking in the art has required denser and more complex patterns to achieve the formation of the denser circuits consisting of smaller pattern elements packed more closely together. Such patterns push the resolution limits of available lithography tools and processes and place serious burdens on the design and quality of the photomasks used therein. To push the resolution limits, advanced photomasks are designed using various Resolution Enhancement Techniques (RET). Optical Proximity Correction (OPC) is one such technique. With OPC the photomask patterns are modified in various ways to help ensure that the printed pattern has good agreement to the original desired pattern. These photomask pattern modifications can include perturbations to the size of main pattern features, the addition of serifs to pattern corners, and the addition of Sub-Resolution Assist Features (SRAFs).

But even with such crafty approaches optical lithography is believed to have certain inherent resolution limitations which define the maximum utility of the lithographic patterning approaches. One of these limitations is defined by the well-known Rayleigh criteria. Techniques such as OPC and SRAF promise advancements in optical lithography ever closer to the elusive Rayleigh resolution limit of $k_1$=0.25. Improving lithography resolution by using RETs to approach the ultimate physical resolving power of a given lithography toolset is often cheaper and timelier than installing a higher-resolution toolset, but it still is costly. In addition to increased reticle cost and rising process complexity, significant resources must be dedicated to the development and implementation of technology-computer-aided design (TCAD) solutions to manage the escalating complexity of RET-related chip layout modifications. But for all of these improvements there is a finite limit to the resolution possible with optical lithography.

In a simplified approximation of coherent illumination, the resolution R of a lithography system is conventionally quoted in terms of the smallest half-pitch of a grating that is resolvable as a function of wavelength (λ) and numerical aperture (NA), as expressed by Rayleigh's equation, $$R = k_1 \frac{\lambda}{NA}$$

As is known, the resolution R of an optical system defines its capability for distinguishing closely spaced objects. Accordingly, resolution defines the minimum line width or space that a lithography system can print.

As is also known, standard lithography techniques involve forming a layer of a photoresist material on a substrate and then exposing it to an optical beam patterned by a photomask in a single exposure to obtain high throughput patterning of the photoresist layer. The photoresist layer is then developed leaving a patterned surface on the substrate which is used create patterned layers on the substrate in accordance with any of a number of well-known fabrication procedures.

Heretofore, resolution improvements were obtained by decreasing the exposure wavelength (λ), increasing the numeric aperture (NA), or decreasing $k_1$. Exposure tool wavelengths (λ) have been progressively shortened from g-line and i-line sources, to 248 nm KrF lasers, 193 nm ArF lasers, and even 157 nm lasers to fabricate at steadily smaller CD nodes. However, each shortening of wavelength is becoming harder to achieve. The same can be said for increasing system NA with so-called immersion systems defining the highest NA systems yet devised. Phase shift and off-axis illumination technologies can be used to provide reductions in $k_1$. However, all of these improvements cost money and increase process complexity.

Additionally, the prior art technologies are all faced with a certain finite limit on resolution which eventually will become too expensive to overcome or impossible to overcome. Thus, although the prior art techniques are generally suitable for the purposes for which they are intended, they suffer from certain limitations, not the least of which being a finite limitation on the pattern density at which such patterns can be printed using photolithographic processes.

Accordingly, the embodiments of invention present substantial advances over the existing methodologies and overcome many limitations of the existing pattern fabrication arts. These and other inventive aspects of the invention will be discussed herein below.

SUMMARY OF THE INVENTION

In accordance with the principles of the present invention, methods for achieving high density patterns using multiple exposures with optical lithography and other techniques are disclosed.

Numerous aspects of the present invention are described in detail in the following description and drawings set forth hereinbelow.

In one embodiment, the invention teaches a method for forming high resolution patterns on a substrate surface. One such process involves providing a photolithographic patterning tool and loading a substrate with a photoimagable layer on the tool. Multiple exposures of the photoimagable layer are performed with the photolithographic patterning tool to define a composite line pattern in the photoimagable layer such that the composite line pattern has a greater pitch density than possible with single exposure with the same photolithographic patterning tool. The lines of the composite line pattern are selectively cut at a plurality of locations to define a desired pattern in the layer of photoimageable material.

In one embodiment, the invention teaches a method for forming high resolution patterns on a substrate surface. This embodiment includes providing a substrate with a photoimagable layer formed thereon and then performing a plurality of photolithographic exposures of the photoimageable layer including a first lithographic exposure of the photoimagable layer to generate a first interference pattern of parallel lines in the photoimagable layer and including a second lithographic exposure of the photoimagable layer to generate a second interference pattern forming a second pattern of parallel lines arranges so that at least some of the second pattern of parallel lines are interspersed between and parallel to the first pattern of parallel lines forming a composite line pattern having an increased pitch density. The lines of the composite line pattern are selectively cut at a plurality of designated locations to define a desired pattern in the layer of photoimageable material. Further operations can involve developing the photoimageable material to define a pattern in the layer and also performing added processing steps to fabricate further structures on the substrate using the pattern defined in the layer.

These and other aspects of the present invention are described in greater detail in the detailed description of the drawings set forth hereinbelow.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the Figures are not necessarily to scale.

DESCRIPTION OF SPECIFIC EMBODIMENTS

Figure 1:
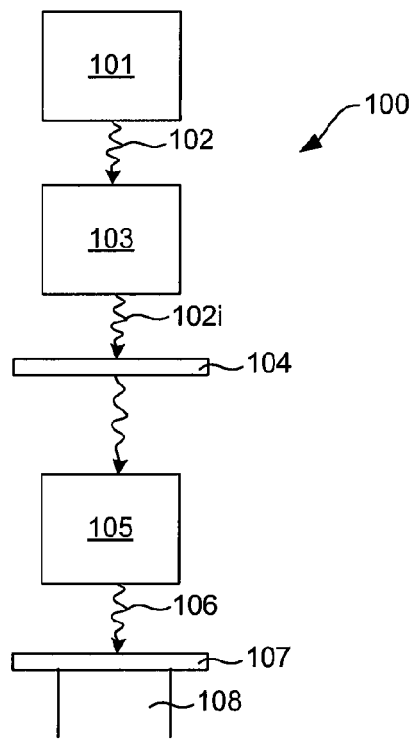
FIG. 1 is schematic depiction of a lithography apparatus, such a stepper or scanner, used to pattern a substrate or wafer.

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following detailed description describes various embodiments of a method and approach for obtaining dense patterns using multiple exposures of a photoimageable surface. The methods disclosed herein enable the formation of dense patterns beyond the resolution possible with a single exposure using the same tool. The disclosed invention uses multiple exposures of a photoimageable surface to obtain a pattern in a photoimageable layer that can be used to form dense circuitry patterns (including, but not limited to line structures, hole and via structures, as well as other circuit structures known in the art) in the surfaces of the chips involved. The dense patterns formed in the photoimageable layers can then be developed and subsequently used to facilitate circuit patterning and structure formation in the underlying layers. Many fabrication processes can be used in accordance with the principles of the invention including, but not limited to, photolithography and direct write technologies.

As hinted at above one, of the problems presently encountered by fabrication technologies (particularly photolithography) is that they are approaching the maximum pattern density available using present technology optical tools (e.g., steppers, scanners, or other lithography devices). The present inventions disclosed herein offer solutions to some of these problems and represent a significant improvement in the art.

As is known, an upper limit of pattern density is posed by Lord Rayliegh's resolution Equation wherein:

$$R = k_1(\lambda/NA)$$

where the resolution R of a lithography system is conventionally quoted in terms of the smallest half-pitch of a grating that is resolvable as a function of wavelength $\lambda$ and numerical aperture NA, where $k_1$ is the Rayleigh constant.

For conventional optical lithography, the ultimate resolution limit is reached at $k_1=0.5$, the state at which only one set of diffracted orders can pass through the imaging optical system. Even as exposure wavelengths decrease from 248 nm to 193 nm and 157 nm and 148 nm, and numerical apertures increase from 0.5 to 0.6, 0.68, 0.75, and even above 1.0, the resolution limit generally stands firm at $k_1=0.5$ stands firm with conventional optical lithography. Approaching $k_1=0.5$ imposes formidable problems due to image quality degradation associated with the loss of increasing numbers of diffracted orders. Off-axis illumination (OAI) and alternating PSM (hereafter referred to simply as "altPSM") are techniques that can be used to overcome this fundamental resolution limit, essentially by eliminating the zeroth diffracted order and thereby imaging with properties similar to a two-beam interference system. These techniques can be used to extend the ultimate resolution limit to the $k_1=0.25$ level.

In integrated-circuitry (IC) manufacturing, the $k_1$ factor is not used so much as a measure of the ultimate resolving power of any given lithography system, but more as a gauge of the difficulty of achieving a particular resolution with given values of $\lambda$ and NA. As pattern dimensions and pitches decrease, fewer diffracted orders are captured by the imaging optical system, causing the wafer image to be reconstructed with less high-frequency detail, thus leading to image quality degradation. Quantified in terms of the lithographic process window (i.e., the range of exposure dose and defocus over which acceptable image size tolerances can be maintained), the ease with which a certain resolution can be achieved is directly related to lithography yield at a fixed linewidth tolerance. However, lithography has become more demanding over time, even though exposure tools have steadily gained resolution by decreasing $\lambda$ and increasing NA. The data are projected toward the hard stop of $k_1=0.25$.

However, the inventors have discovered that by introducing certain process changes into existing lithographic processes significant increases in resolution can be made possible. Additionally, the processed can be further enhanced by integrating certain non-optical techniques into a process flow.

In accordance with some embodiments of the invention standard photolithographic tools can be used to enable substantially improved resolution. Such tools include, but are not limited to scanners, steppers, and other image projection lithography tools. FIG. 1 is a simplified schematic depiction of an example photolithographic tool 100 of a suitable type.

The applicants specifically point out that the following description is intended only to be descriptive and not limiting. The tool generally includes an optical exposure source 101 that produces a light beam 102. As is known to those of ordinary skill there are many different light sources, ranging from broadband sources, to filtered sources (such as g-line sources or i-line sources), to laser sources (e.g., 248 nm, 193 nm, 157 nm, 148 nm lasers and so on). The beam is directed through an illumination optical system 103 to produce an illumination beam 102i. The illumination optical system can be any of a number of illumination optical systems known to those having ordinary skill in the art. Example include, low NA systems, high NA systems, even immersion optical systems that contemplate high NA effects well in excess of 1.0. The illumination beam is projected through a mask reticle 104 to produce a beam having the desired optical pattern. Generally, this patterned beam is passed through projection optical systems 105 to form a patterned beam 106 that is directed onto a target (e.g., a wafer or other appropriate substrate) 104. Often the optical system include a wide range of photomasks or other photolithographic pattern transfer apparatuses 104 such that when illuminated with the source, and passed through appropriate projection optics 105 a desired light beam pattern 106 is projected onto the target 107. The target 107 is generally mounted on a stage 108 or other securement structure that enables alignment and highly controlled movement of the target 107 to enable high definition pattern transfer onto a photoimageable layer on the surface of the target 107. Such photoimageable layers are typically photoresist materials of a type well known to the skilled practioner.

As explained above, such devices in ordinary use encounter the Rayleigh resolution limit. The need for high throughput in such systems has heretofore made the employment of single exposure optical devices of paramount importance. The inventors posit that by going against the current thinking in the art and employing many exposures per layer of photoresist an extremely high-resolution pattern, far beyond that possible with single exposure methods can be obtained. Such methodologies will be explained in the following disclosure.

Figure 2:
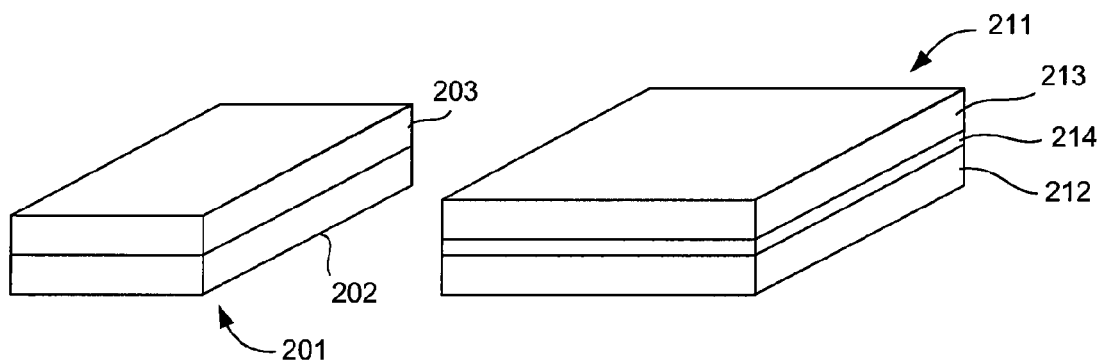
FIG. 2 is schematic depiction of suitable examples of substrate embodiments capable of being used in accordance with the principles of the invention.

FIG. 2 depicts two simplified depictions of a target embodiments constructed in accordance with the principles of the invention. The inventors again wish to point out that the following is merely an illustration and is not intended to be limiting. One target embodiment 201 includes a substrate 202 having a plurality of circuitry elements (e.g., integrated circuitry and associated electronic elements and components) formed thereon. Commonly, one such substrate embodiment 202 can be a semiconductor wafer. Formed thereon is layer of photoimageable material 203 of a type well known in the art. Examples, include, but are not limited to positive and negative photoresist materials. Such materials are exposed and then developed to form a desired pattern on the substrate 202 that can be used to form other layers having a desired pattern.

Another target embodiment 211 is only slightly different in configuration and is processed in a similar fashion. Embodiment 211 includes a substrate 212 having a plurality of circuitry elements (e.g., integrated circuitry and associated electronic elements and components) formed thereon. Again, one such substrate 212 can be a semiconductor wafer. A layer of fabrication material 214 is formed on top of the substrate 212. The fabrication material can be any of a number of materials and/or structures including conductors, insulators, multilayer structures, circuitry, and so on. Formed on this layer is layer of photoimageable material 213 of a type discussed above. Such materials are exposed and then developed to form a desired pattern. This pattern can be used to facilitate pattern formation on the substrate 202 or on the material 214 and can be used to form other layers having a desired pattern. Such patterns can be formed using etching and deposition and a variety of other techniques as well as combinations of such fabrication processes.

The simplified illustrations of FIGS. 3A-3D illustrate one approach to implementing the principles of the invention.

Figure 3A:
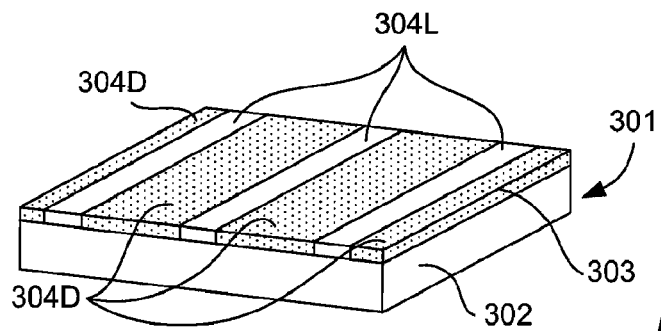
FIGS. 3A-3D provide a simplified flow diagram illustrating a method embodiment that implements process operations in accordance with an embodiment of the invention.

FIG. 3A depicts a simplified example of a suitable target embodiment 301 (similar to that depicted in FIG. 2). The embodiment 301 includes a substrate 302 (e.g., wafer) that can have a plurality of circuitry elements formed thereon. A layer of photoimageable material 303 (i.e., photoresist) is formed on top. The target is exposed to a repetitive line pattern that is transferred to the layer 303. The pattern can be formed by generating an interference pattern. Many, method of generating such patterns are known (include, but are not limited to gratings, specially constructed masks, specifically selected illumination sources and so on). The layer 303 shows one example of a repetitive line pattern formed by an interference pattern of a lithographic exposure. In the depicted example, a photolithographic exposure with an interference pattern forms a pattern of dark lines 304D interlaced with a pattern of light (lines 304L) all formed in the layer 303 of photoimageable material. Although not strictly necessary, in one such case the pattern of lines can be formed at the maximum resolution possible with the photolithography tool used to form the pattern.

This first exposure is then developed (See, e.g., FIG. 3B) and a portion of the final the desired pattern is formed in the photoimageable material 303 (i.e., photoresist). The process then is subjected to further exposures.

Figure 3B:
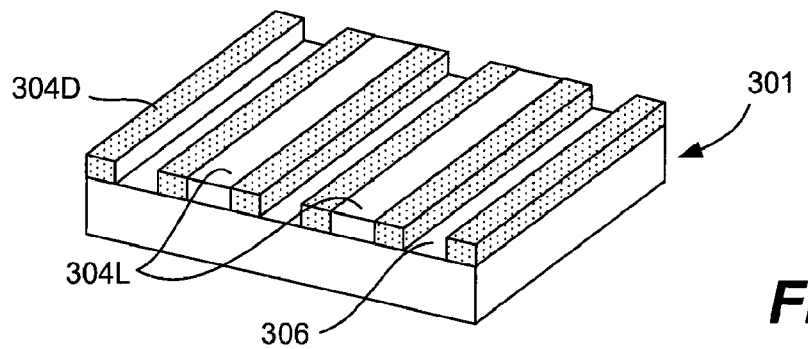

FIG. 3B depicts an exposure developed layer to a second line pattern. This second exposure is performed after the first pattern exposure is made and a post-exposure development is completed. The second pattern can be formed by generating another interference exposure pattern. Accordingly, the target is then positioned and realigned to enable exposure to another exposure pattern. In the depicted illustration, the "another" exposure pattern is a second interference pattern aligned to expose previously unexposed portions of the photoresist layer. Of course the details and particulars of the process can vary depending on the type of photoresist used (e.g., positive or negative). The second pattern of light lines 305L is exposes portions interlaced between the existing developed patterns defined by 306. The layer 303 now shows one example of a repetitive line pattern formed by a second interference pattern during a second lithographic exposure. The inventors point out that many exposures (not just two) can be employed to generate a high resolution pattern of light and dark lines in accordance with the principles of the invention. The number or exposures is dictated largely by the degree of resolution required and the degree of resolution possible with a single exposure of the tool. The number of exposures will also take into consideration the number of expose-develop-expose cycles that are practical from a throughput stand point since each exposure requires a separate development cycle. It should also be noted that the repetitive line patterns can be formed using perpendicular line structures if desired. The inventors also point out that using such methodologies it is possible to construct composite line patterns having pitch densities having a half-pitch resolution of less than 64 nanometers using a standard 193 nm exposure source. Moreover, depending on the number of exposures used the inventors suggest that half-pitch resolutions of less than about 16 nanometers can be obtained using a 193 nm exposure sources. Additionally, the inventors specifically contemplate that as higher NA systems (e.g., immersion systems) are employed even further refinements and greater resolutions are made possible using the inventive principles described herein.

In addition to patterns of lines other features can and are frequently formed in accordance with the disclosed embodiments of the invention. For example, if it is desirous to form a pattern of vias or conversely a pattern of raised contacts or other "dot" structures that can be easily facilitated in accordance with the principles of the invention. Additionally, the "lines" formed in FIGS. 3A and 3B can also be cut into shorter segments using the disclosed embodiments.

Although not strictly necessary, in one such case the pattern of lines can be formed at the maximum resolution possible with the photolithography tool used to form the pattern.

Figure 3C:
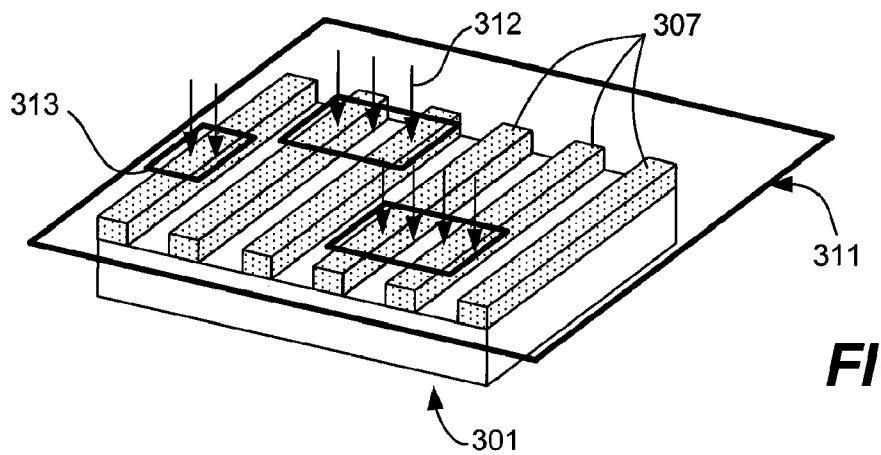

FIG. 3C depicts a substrate 301 having been processed using a plurality of exposure and development cycles. Such multiple exposure and development steps enable the formation of a high density set of lines 307 in the photoresist layer. These lines can be "cut" (that is to say exposed to light at appropriate locations and developed) to segment the longer lines 307. For example, in one implementation the substrate 301 (particularly the photoresist pattern formed thereon e.g., 307) is exposed to a light pattern formed by light 312 passing through apertures 313 of a photomask 311 to expose the "cut sites" in the dark (un-exposed) lines of the resist layer which are later developed to further segment or trim the lines 307. If the cut density is required to be beyond the resolution of that possible with the tool, several exposures and developments can be used to trim the desired pattern with the required "cuts". This will be explained in greater detail hereinbelow. Alternatively, the "cut sites" can be exposed alternatively using direct write technologies (e.g., e-beams, ion beams) and other associated high precision technologies including, but not limited to, optical, EUV, X-ray, and other exposure tools. Then development can be performed. Such embodiments have particular utility using an alternative high precision tool like an e-beam tool that has extraordinary capacity to form dots and dot patterns and having high resolution beyond that of most standard optical lithography tools. Thus, a combination of optical lithography techniques (which are good at generating line patterns) and direct write tools (such as e-beam technologies), which are good at generating dot patterns, can be used to create high definition patterns of extremely high resolution. The inventors also point out that the order of process is not necessarily important. For example, the "cuts" could be formed prior to the formation of the pattern of lines. These and other changes in the process will be evident to those having ordinary skill in the art upon reading this disclosure. Finally, it is pointed out that the description accompanying FIGS. 6A-6D (explained below) can also be used as a method for cutting and/or trimming the lines depicted in FIGS. 3A-3D.

Figure 3D:
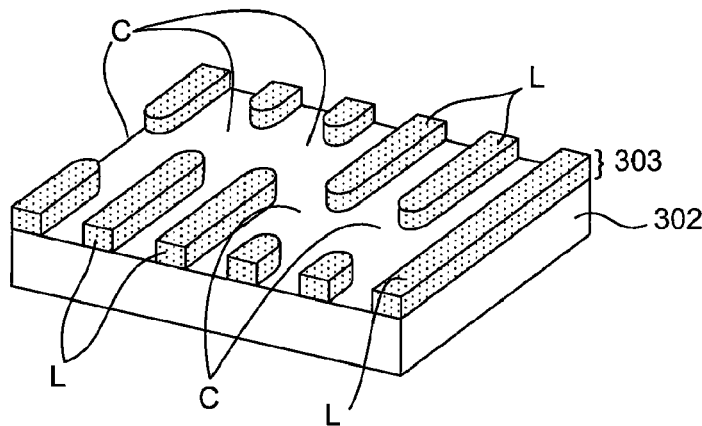

FIG. 3D is a simplified depiction of a resultant pattern formed by the previous multiple exposure and development operations are performed on the layer of photoresist. The photoresist layer 303 now features a pattern of lines L and cuts C and of course the patterns of light lines interspersed therebetween. Once the photoimageable material 303 has been repeatedly exposed and developed to form a desired pattern on the substrate 301 that can be used to form other layers having a desired pattern. The approach depicted in FIGS. 3A-3D is effective for generating cut sites of many varieties. Additionally, the step shown in FIG. 3C can be repeated many times with different masks to obtain dense cut patterns. Additionally, the approach depicted in FIGS. 3A-3D is particularly suitable for generating patterns with distributed (non-regular) cut sites.

The simplified illustrations of FIGS. 4A-4D illustrate another embodiment for implementing the principles of the invention.

Figure 4A:
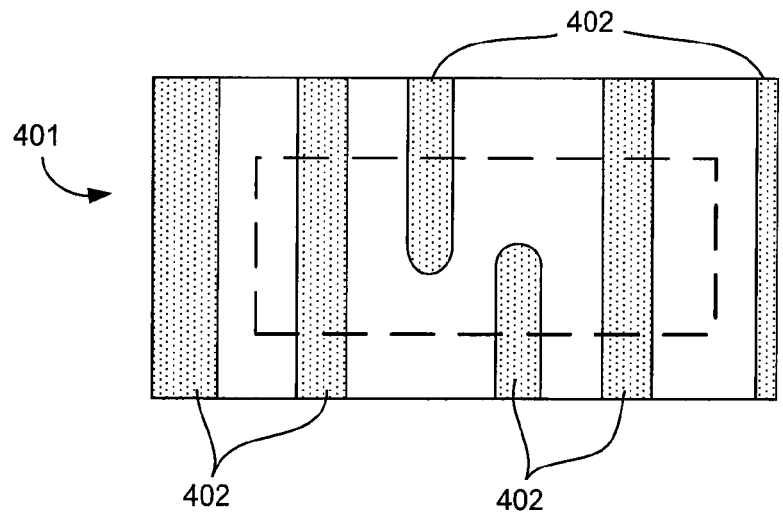
FIGS. 4A-4D provide another simplified flow diagram illustrating another method embodiment for implementing process operations for constructing an SRAM circuit element in accordance with an embodiment of the invention.

FIG. 4A depicts a simplified plan view of a substrate that can be processed to construct an SRAM circuit. It should be noted that although disclosed with respect to an SRAM device the principles of the invention can be employed to fabricate a wide range of different integrated circuit elements. Moreover, the depicted substrate merely comprises one portion of a much larger substrate (typically an entire wafer). The substrate 401 has a number of circuit elements formed thereon. In particular, a set of interconnected gate stacks 402 are shown formed on the surface. Additionally, transistor source and drain regions lie between the gate stacks 402. The depicted substrate 401 is also shown with a dashed line 403 indicating the section defined by an SRAM IC element. Such circuit configurations are well known to those having ordinary skill. A layer of photoimageable material (i.e., photoresist) is formed on top of the entire depicted surface.

Figure 4B:
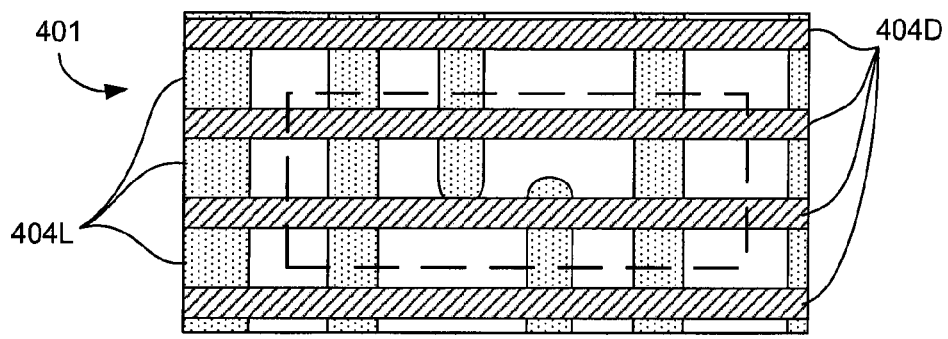

As shown in FIG. 4B, the target is exposed to a repetitive line pattern that is transferred to the layer 302. The pattern can be made using one exposure development cycle or a multiplicity of such cycles depending on the pattern density required an/or the time constraints for the process or other factors. Generally a plurality of exposures and developments are used to obtain the desired interlaced pattern of light patterns 404L and dark patterns 404D. As pointed out previously, the exact pattern of light and dark is not intended to be limiting. One of ordinary skill understands that various photoresist types, fabrication processes used, circuitry elements and configurations, as well as substrate geometries make available and necessary a wide range of possible exposure configurations. The photoresist layer now shows one example of a repetitive line pattern (404L, 404D) formed by a plurality of interference patterns during a plurality of lithographic exposure and development cycles. As before, the number or exposures is dictated largely by the degree of resolution required and the degree of resolution possible with a single exposure of the tool.

Figure 4C:
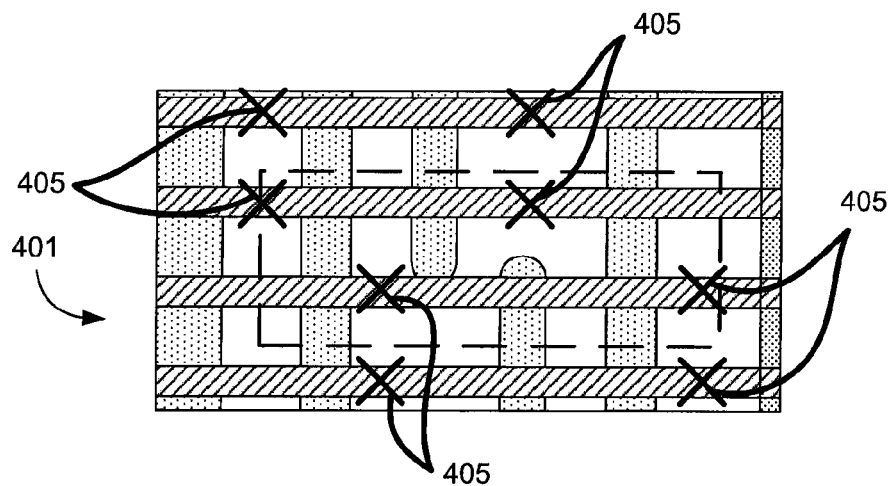

FIG. 4C depicts an exposure of the substrate 401 to an e-beam tool to form "cuts" (the X's 405) in the dark (unexposed) lines 404D of the resist layer. Alternatively, optical lithographic exposures could be used to form the desired pattern of "cuts". Additionally, it is pointed out that the description accompanying FIGS. 6A-6D (explained below) can also be used as a method for cutting and/or trimming the lines depicted in FIGS. 4A-4D.

Figure 4D:
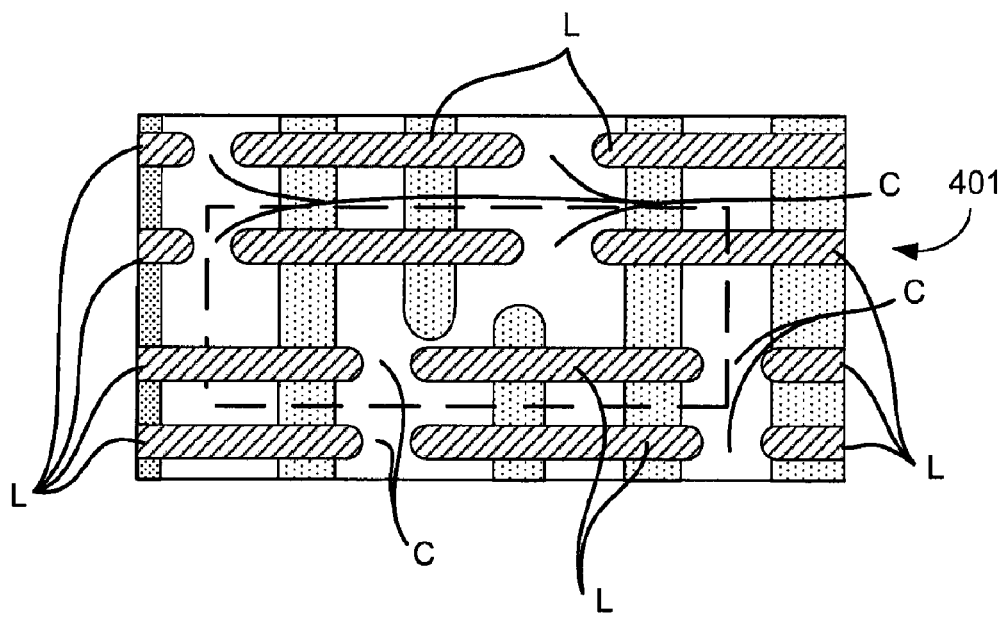

FIG. 4D is a simplified depiction of the resultant pattern formed by the previous exposure steps. The photoresist layer now features a pattern of broken lines L and associated cuts C (and of course the patterns of light lines interspersed therebetween). Once the photoimageable material is exposed to obtain the desired pattern it can then be developed to form a desired pattern on the substrate 401 that can be used to form other layers having a desired pattern. For example the lines can represent openings that enable the deposition of conductive material to interconnect the gates. Equally, possible is a configuration whereby a conductive layer is deposited before the application of the photoresist. In which case the photoresist pattern will be configured such that the excess and unnecessary conductive material can be removed (e.g., by etching).

Figure 5A:
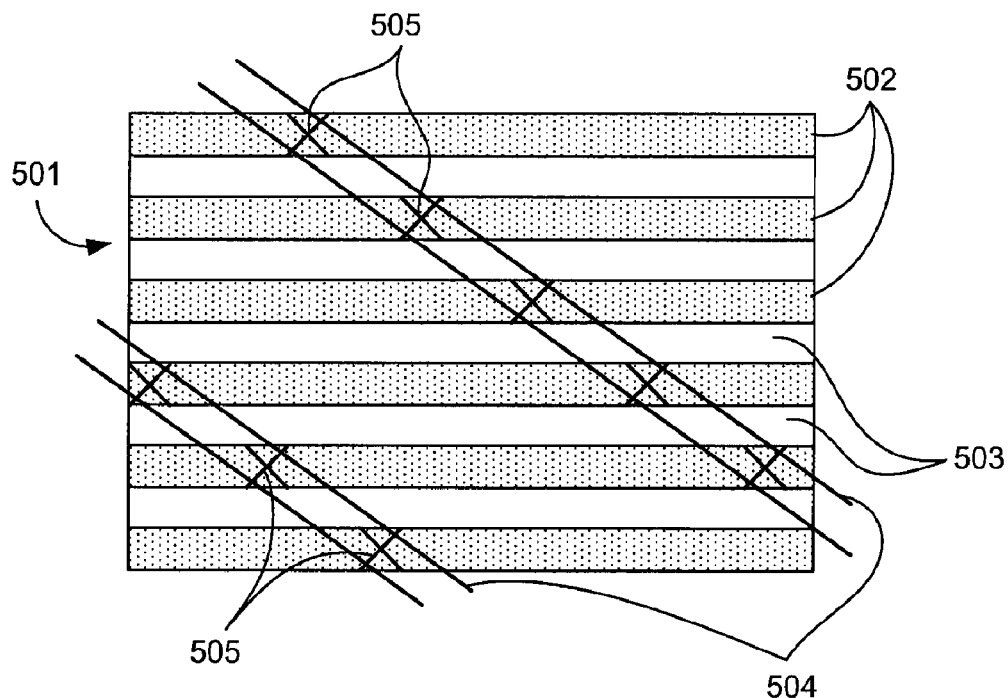
FIGS. 5A-5B provide a simplified flow diagram illustrating a method embodiment for implementing process operation that enables cuts to be formed using an optical lithography interference pattern in accordance with an embodiment of the invention.
Figure 5B:
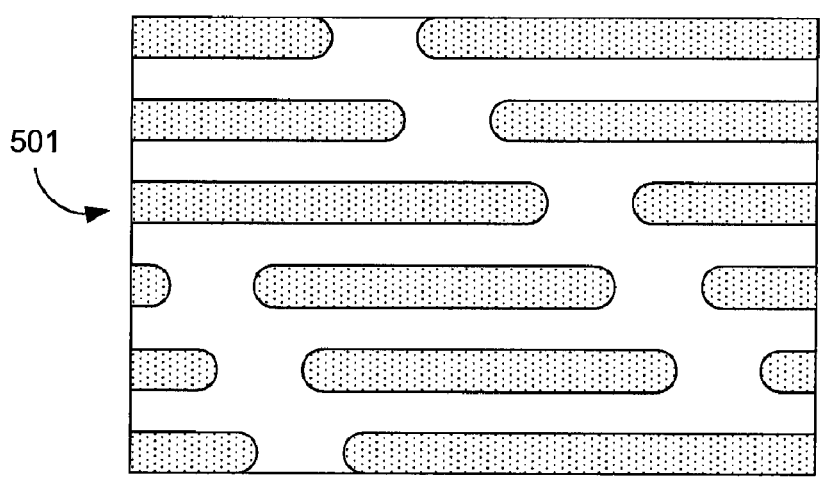

The simplified illustrations of FIGS. 5A-5B illustrate another embodiment for implementing the principles of the invention.

FIG. 5A depicts a simplified plan view of a substrate that can be processed to construct a patterned surface. The depicted substrate 501 can be formed in a number of ways including, but not limited to, the examples shown in FIGS. 3A, 3B, 4B, and so on. The depicted target 501 is shown after being exposed to a repetitive line pattern of dark 502 and light 503 lines. In the depicted embodiment, a second pattern of lines 504 is generated to form "cuts" (the X's 505) in the line pattern (502, 503). This second pattern of lines 504 can be formed with one exposure. But, generally a plurality of exposures are used to obtain the desired cut pattern. As pointed out previously, the exact pattern of light and dark is not intended to be limiting. One of ordinary skill understands that various photoresist types, fabrication processes used, circuitry elements and configurations, as well as substrate geometries make available and necessary a wide range of possible exposure configurations. As before, the number or exposures is dictated largely by the degree of resolution required and the degree of resolution possible with a single exposure of the tool.

Using the pattern made in FIG. 5A, FIG. 5B is a simplified depiction of the resultant developed photoresist layer. The photoresist layer now features a pattern of broken lines and associated cuts. This method is very useful when employed to generate patterns having a repetitive pattern (hence its adaptability to two intersecting line patterns). Once the photoresist is developed, the resultant desired pattern on the can be used to form other layers consistent with the defined pattern.

The following FIGS. 6A-6D are simplified depictions of approaches that can be used in accordance with the principles of the invention to generate a dense pattern of holes or trim cuts or other small features (such as vias, contact pads, and so on).

Figure 6A:
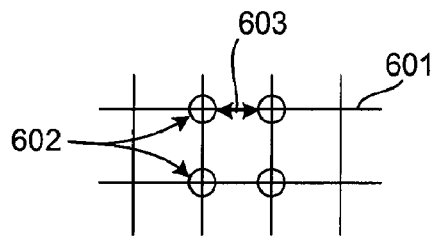
FIGS. 6A-6D provide a simplified flow diagram illustrating a method embodiment that implements process operations enabling high density dot patterns to be formed beyond the optical resolution of the patterning tool in accordance with an embodiment of the invention.

Referring to FIG. 6A, a grid 601 is shown defining a high-resolution node having a half-pitch of about 32 nanometers (nm). Thus, the depicted pattern of dots 602 formed by a lithography tool comprises a set of dots separated by about 65 nm (603). Thus, the depicted dot pattern describes a unit cell at the 65 nm node. Such "nodes" are well understood by those having ordinary skill in the art, and are constructed in accord with well-defined design rules such as those indicated in the International Technology Roadmap for Semiconductors (ITRS) standards. The applicants demonstrate that this degree of pattern density can be achieved using older tools or tools designed for patterning at older nodes.

Figure 6B:
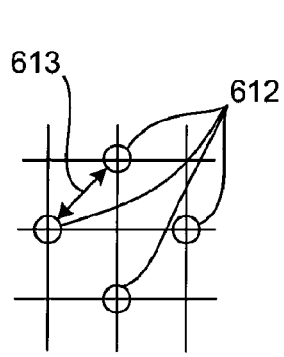
Figure 6B:
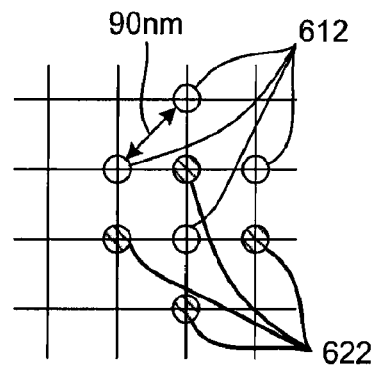

For example, FIG. 6B illustrates a pattern of dots 612 formed on the same grid 601 as above. This dot pattern 612 can be fabricated with a tool at the −1 node (a step down in resolution from the 65 nm node above). For example, the node can define a unit cell having a half-pitch of about 45 nm. Thus, the depicted pattern of dots 602 formed by a lithography tool comprises a set of dots separated by about 90 nm (613).

FIG. 6B' illustrates an embodiment for using multiple exposures at a lower density node (e.g., 90 nm node) to achieve 65 nm node (32 nm half-pitch) type dot density. A first exposure generates a first dot pattern 612 at the 90 nm node (having only a 45 nm half-pitch). Then the first exposure is developed. Then, by generating a second pattern 622 (of the same 45 nm half-pitch resolution) that is offset relative to the first the first dot pattern 612, an aggregate dot pitch having an increased pattern density can be formed. It is to be noted that although 4 dots are shown the unit pattern can actually expose any or the dots (0, 1, 2, 3, 4). The same can be said for all such dot patterns explained herein. Thus two lower resolution exposures can be used to obtain an increased resolution dot pattern. This will be achieved at the cost of a reduced throughput. However, it has the advantage of being able to take advantage of older lower resolution tools to achieve high resolution patterns.

Figure 6C:
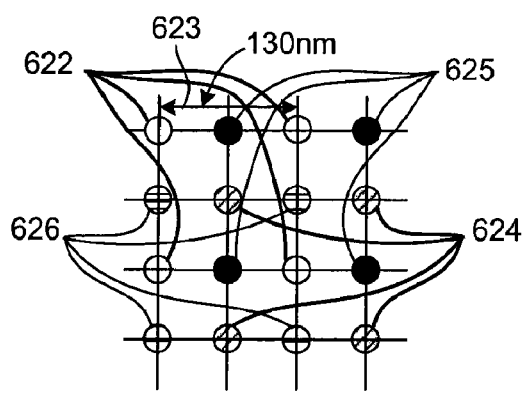

For example, FIG. 6C illustrates another pattern of dots 622 formed on the same grid 601 as above. This dot pattern 622 can be fabricated with a tool two nodes back (e.g., at the −2 node, two steps down in resolution from the 65 nm node above to perhaps the 130 nm node). Such a node can, for example, define a unit cell having a half-pitch of about 65 nm. Thus, the depicted pattern of dots 622 formed by a lithography tool comprises a set of dots separated by the indicated about 130 nm (623). FIG. 6C further illustrates the use of multiple exposures at the lower density node (e.g., 130 nm node) to achieve 65 nm node (32 nm half-pitch) type dot density. A first exposure generates a first dot pattern 622 at the 130 nm node (having a 65 nm half-pitch). After developing the first exposure, an offset second exposure generates a second dot pattern 624, after a second development a third offset exposure generates a third dot pattern 625, and after a third development, a fourth offset exposure generates a fourth dot pattern 626. Thus, in this embodiment, four exposures at the 130 nm node (−2 node) can be used to generate a pattern density on the order of the desired 32 nm half-pitch. As is noted above, such patterns do not require all dots to be exposed, the unit pattern can actually expose any of the dots (0, 1, 2, 3, 4).

Figure 6D:
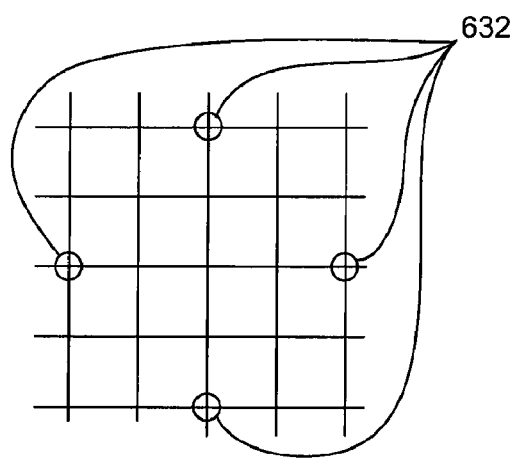

FIG. 6D depicts another step back to a −3 node that can define a node three steps down in resolution from the 65 nm node described above (to perhaps the 180 nm node). Such a node can, for example, define a unit cell having a half-pitch of about 90 nm. Thus, the depicted pattern of dots 632 formed by a lithography tool comprises a set of dots separated by the indicated about 180 nm. By forming repetitive offset patterns of dots during a plurality of offset exposures a pattern of dots of increased density can be formed having an aggregate density approaching almost any desired pattern density.

Thus multiple lower resolution exposures can be used to obtain an increased resolution dot pattern. This will be achieved at the cost of a reduced throughput. However, it has the advantage of being able to take advantage of older lower resolution tools to achieve high resolution patterns. The inventors point out that using such methodologies it is possible to construct composite dot patterns having dot pitch densities half-pitch resolutions of less than 64 nanometers using a standard 193 nm exposure sources. Moreover, depending on the number of exposures used the inventors suggest that half-pitch resolutions of less than about 16 nanometers can be obtained using a 193 nm exposure sources. The inventors further contemplate that using high NA systems (especially those with NA's above 1.0 (e.g., such as can be achieved with immersion optical systems)) even greater resolution can be obtained.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element, which is not specifically disclosed herein.

I claim:

1. A method for forming high resolution patterns on a substrate surface, the method comprising:
   providing a photolithographic patterning tool;
   loading onto the tool, a substrate having a photoimagable layer formed thereon;
   performing multiple exposures and developments of the photoimagable layer with the photolithographic patterning tool to define a composite line pattern in the photoimagable layer having a greater pitch density than possible with single exposure with the same photolithographic patterning tool where a first pattern of parallel lines in the photoimagable layer is developed before a second lithographic exposure of the photoimagable layer; and
   selectively cutting the lines of the composite line pattern at a plurality of locations to define a desired pattern in the layer of photoimageable material.

2. A method as recited in claim 1 wherein performing multiple exposures and developments of the photoimagable layer with the photolithographic patterning tool to define a composite line pattern are performed to enable the formation of a composite line pattern have a greater line density than possible with single exposure with the same photolithographic patterning tool.

3. A method as recited in claim 1 wherein selectively cutting the lines of the composite line pattern at a plurality of locations comprises photo-lithographically exposing selected cut sites and then developing the cut sites to effectuate cutting the lines of the composite line pattern.

4. A method as recited in claim 3 wherein selectively cutting the lines of the composite line pattern is achieved using multiple exposures of the photoimagable layer with the photolithographic patterning tool and a plurality of photomasks and performing multiple development operations sites to effectuate cutting the lines of the composite line pattern.

5. A method as recited in claim 4 wherein the multiple exposures and developments of the photoimagable layer with the photolithographic patterning tool are performed such that the cuts formed have a greater resolution than possible with single exposure with the same photolithographic patterning tool.

6. A method as recited in claim 4 wherein the multiple exposures are achieved using multiple exposures of the photoimagable layer with a plurality of binary photomasks.

7. A method as recited in claim 1 wherein selectively cutting the lines of the composite line pattern at a plurality of locations comprises exposing cut sites in the lines of the composite line pattern with a direct write tool and developing the cut sites.

8. A method as recited in claim 7 wherein exposing in the cut sites with a direct write tool comprises exposing cut sites with an e-beam tool.

9. A method as recited in claim 1 wherein the substrate comprises a semiconductor wafer having a plurality of devices areas formed thereon.

10. A method for forming high resolution patterns on a substrate surface, the method comprising:
    providing a substrate with a photoimagable layer formed thereon;
    performing a first lithographic exposure of the photoimagable layer, thereby generating a first interference pattern to form a first pattern of parallel lines in the photoimagable layer;
    developing the first pattern of parallel lines in the photoimagable layer;
    performing a second lithographic exposure of the photoimagable layer, thereby generating a second interference pattern to form a second pattern of parallel lines in the photoimagable layer, wherein at least some of the second pattern of parallel lines are interspersed between and parallel to the lines of the first pattern of parallel lines thereby defining a composite line pattern having an increased pitch density;
    developing the second pattern of parallel lines in the photoimagable layer; and
    selectively cutting the lines of the composite line pattern at a selected plurality of locations to define a desired pattern in the layer of photoimageable material.

11. A method as recited in claim 10 further including developing the desired pattern in the photoimageable material.

12. A method as recited in claim 10 wherein performing the second lithographic exposure to define a composite line pattern having increasing pitch density enables a pitch density beyond the resolution possible with a single exposure on a similar photolithographic patterning tool.

13. A method as recited in claim 12 wherein said performing of the first and second lithographic exposures enables the formation of the composite line pattern having a pitch density with a half-pitch of less than about 64 nanometers using a 193 nm exposure source.

14. A method as recited in claim 13 wherein said performing of the first and second lithographic exposures enables the formation of the composite line pattern having a pitch density with a half-pitch of less than about 16 nanometers using a 193 nm exposure source.

15. A method as recited in claim 10 wherein selectively cutting the lines of the composite line pattern comprises exposing cut sites to an e-beam to generate a cut pattern in the composite line pattern and then developing the cut pattern to effectuate the cutting of the composite line pattern to define the desired pattern in the layer of photoimageable material.

16. A method as recited in claim 10 wherein selectively cutting the lines of the composite line pattern comprises exposing selected portions of the composite line pattern using optical lithography techniques and then developing the layer of photoimageable material to effectuate cutting of the composite line pattern at cut sites to define the desired pattern in the layer of photoimageable material.

17. A method as recited in claim 16 wherein exposing selected portions of the composite line pattern includes using a mask pattern to generate an illumination pattern that exposes said selected portions in the layer of photoimageable material and then developing the layer of photoimageable material to effectuate cutting of the composite line pattern at cut sites to define the desired pattern in the layer of photoimageable material.

18. A method as recited in claim 10 wherein selectively cutting the lines of the composite line pattern comprises:
    using a first optical lithography exposure to a first set of cut sites in the composite line pattern;
    developing the first set of cut sites to form a first set of cuts in the composite line pattern;
    using a second optical lithography exposure to a second set of cut sites in the composite line pattern;
    developing the second set of cut sites to form a second set of cuts in the composite line pattern to define the desired pattern of lines and cuts in the layer of photoimageable material.

19. A method as recited in claim 18 wherein the first optical lithography exposure and the second optical lithography exposure enable a pattern of cuts having a cut spacing and density beyond the resolution possible with a single exposure on a similar photolithographic patterning tool.

20. A method for forming high resolution patterns on a substrate surface, the method comprising:

providing a substrate with a photoresist layer formed thereon;

performing a first lithographic exposure of the photoresist layer, thereby generating a first interference pattern to form a first pattern of parallel lines in the photoresist layer;

developing the first pattern of parallel lines in the photoresist layer;

performing an additional lithographic exposure of the photoresist layer, thereby generating an additional interference pattern to form an additional pattern of parallel lines in the photoresist layer, wherein at least a portion of the additional pattern of parallel lines is interspersed between and parallel to the lines of the first pattern of parallel lines thereby defining a composite line pattern having an increased pitch density including a half-pitch resolution of less than 64 nanometers when using a standard 193 nanometer exposure source;

developing the additional pattern of parallel lines in the photoresist layer; and selectively cutting the lines of the composite line pattern at a selected plurality of locations to define a desired pattern in the layer of photoresist material.

* * * * *